United States Patent
Kim et al.

(10) Patent No.: US 9,830,038 B2
(45) Date of Patent: Nov. 28, 2017

(54) TOUCH SUBSTRATE, METHOD OF MANUFACTURING THE SAME AND DISPLAY DEVICE HAVING THE SAME

(71) Applicant: SAMSUNG DISPLAY CO., LTD., Yongin-si, Gyeonggi-do (KR)

(72) Inventors: Kyu-Young Kim, Suwon-si (KR); Bo-Sung Kim, Seoul (KR); Youn-Gu Lee, Suwon-si (KR); Nam-Ok Jung, Hwaseong-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 165 days.

(21) Appl. No.: 14/965,123

(22) Filed: Dec. 10, 2015

(65) Prior Publication Data

US 2016/0098130 A1    Apr. 7, 2016

Related U.S. Application Data

(62) Division of application No. 12/900,658, filed on Oct. 8, 2010, now Pat. No. 9,239,651.

(30) Foreign Application Priority Data

Oct. 23, 2009    (KR) .................. 10-2009-0101149

(51) Int. Cl.
*B29C 39/22* (2006.01)
*B29C 41/38* (2006.01)
(Continued)

(52) U.S. Cl.
CPC .............. *G06F 3/045* (2013.01); *G06F 3/044* (2013.01); *G06F 2203/04103* (2013.01);
(Continued)

(58) Field of Classification Search
CPC . G06F 2203/04103; G06F 2203/04111; G06F 2203/04112; G06F 3/044; G06F 3/04; H05K 3/1275
(Continued)

(56) References Cited

U.S. PATENT DOCUMENTS 8,373,675 B2    2/2013  Jeon et al.
2006/0181516 A1  8/2006  Staines
(Continued)

FOREIGN PATENT DOCUMENTS

CN    101038385 A    9/2007
CN    101078961      11/2007
(Continued)

OTHER PUBLICATIONS

Office Action for KR1020090101149.*
(Continued)

*Primary Examiner* — Sonya Mazumdar
(74) *Attorney, Agent, or Firm* — F. Chau & Associates, LLC

(57) ABSTRACT

A touch substrate includes a base substrate, a common electrode and a wire electrode. The base substrate has a plurality of common electrode areas. A common electrode is disposed in each of the common electrode areas. The common electrode has a plurality of first electrode lines extended in a first direction and arranged in a second direction crossing the first direction and a plurality of second electrode lines arranged in the first direction. The wire electrode is connected to an end of the common electrode to apply a voltage to the common electrode. The common electrode and the wire electrode are simultaneously formed through a same process using a printing substrate.

8 Claims, 17 Drawing Sheets

(51) Int. Cl.
*G06F 3/045* (2006.01)
*G06F 3/044* (2006.01)
*H05K 3/12* (2006.01)

(52) U.S. Cl.
CPC ............ *G06F 2203/04111* (2013.01); *G06F 2203/04112* (2013.01); *H05K 3/1275* (2013.01)

(58) Field of Classification Search
USPC ........................... 427/58; 156/232, 242, 500
See application file for complete search history.

(56) References Cited

U.S. PATENT DOCUMENTS

| | | | |
|---|---|---|---|
| 2007/0001957 A1 | 1/2007 | Moon et al. | |
| 2007/0195029 A1 | 8/2007 | Jeon et al. | |
| 2008/0192001 A1 | 8/2008 | Choi et al. | |
| 2009/0002337 A1 | 1/2009 | Chang | |
| 2009/0073138 A1 | 3/2009 | Lee et al. | |
| 2009/0133941 A1 | 5/2009 | Endo | |
| 2011/0032241 A1 | 2/2011 | Jeong et al. | |

FOREIGN PATENT DOCUMENTS

| | | | | |
|---|---|---|---|---|
| CN | 101118470 | | 2/2008 | |
| JP | 59202434 A | * | 11/1984 | ........... G02F 1/1339 |
| JP | 08-287775 | | 11/1996 | |
| JP | 09-152940 | | 6/1997 | |
| JP | 2001-296970 | | 10/2001 | |
| JP | 2004-152221 | | 5/2004 | |
| JP | 2005-004388 | | 1/2005 | |
| JP | 2006-221635 | | 8/2006 | |
| JP | 2007-011997 | | 1/2007 | |
| JP | 2009-009574 | | 1/2009 | |
| JP | 2009-129375 | | 6/2009 | |
| KR | 100215125 | | 5/1999 | |
| KR | 100215125 B1 | * | 8/1999 | |
| KR | 20020009034 A | * | 2/2002 | |
| KR | 1020020009034 | | 2/2002 | |
| KR | 2004012291 A | * | 2/2004 | |
| KR | 1020040012291 | | 2/2004 | |
| KR | 20060090931 A | * | 8/2006 | ........... G06F 3/045 |
| KR | 1020060090931 | | 8/2006 | |
| KR | 1020070082959 | | 8/2007 | |
| KR | 1020090015414 | | 2/2009 | |
| KR | 20090040695 A | * | 4/2009 | |
| KR | 1020090040695 | | 4/2009 | |
| KR | 20090054894 A | * | 6/2009 | ........... G06F 3/045 |
| KR | 1020090054894 | | 6/2009 | |

OTHER PUBLICATIONS

Translation of JP59202434A.*
Office Action dated Nov. 20, 2015 in the corresponding Korean Patent Application No. 2009-0101149.
Chinese Office Action dated Feb. 2, 2015 in corresponding Chinese Patent Appln. No. 201010527757.8.
Chinese Office Action dated Jun. 26, 2014 in corresponding Chinese Appln. No. 201010527757.8.

* cited by examiner

FIG. 11
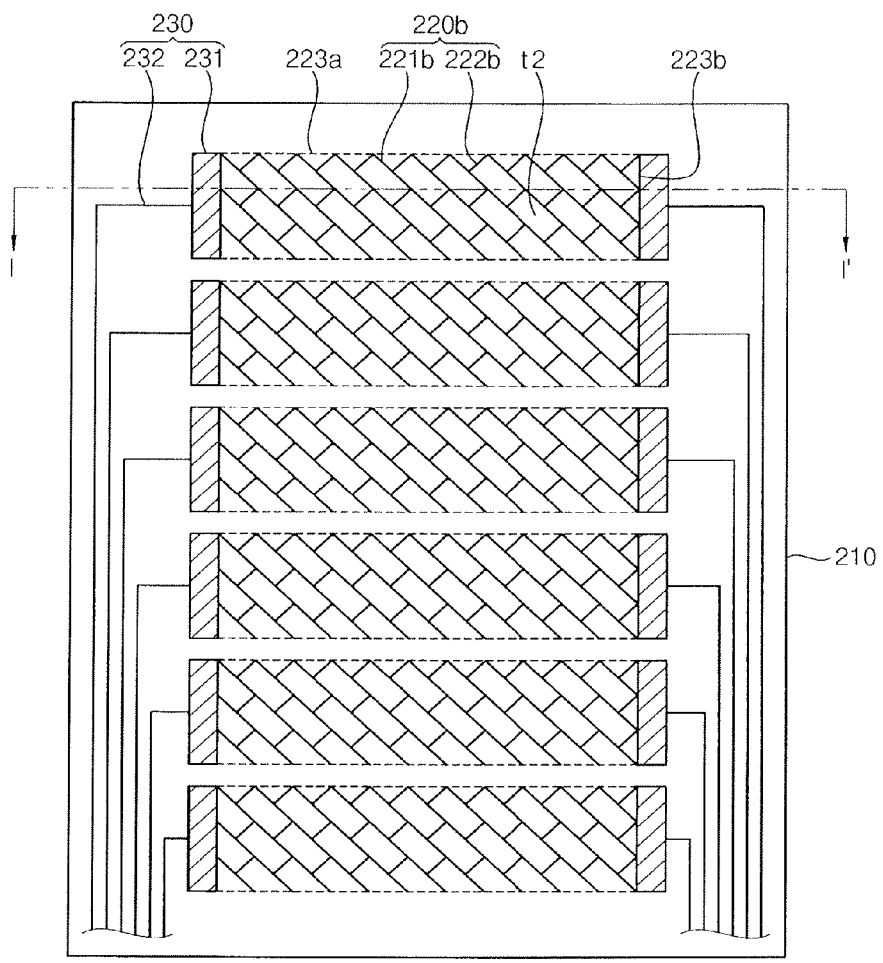
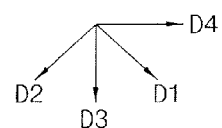

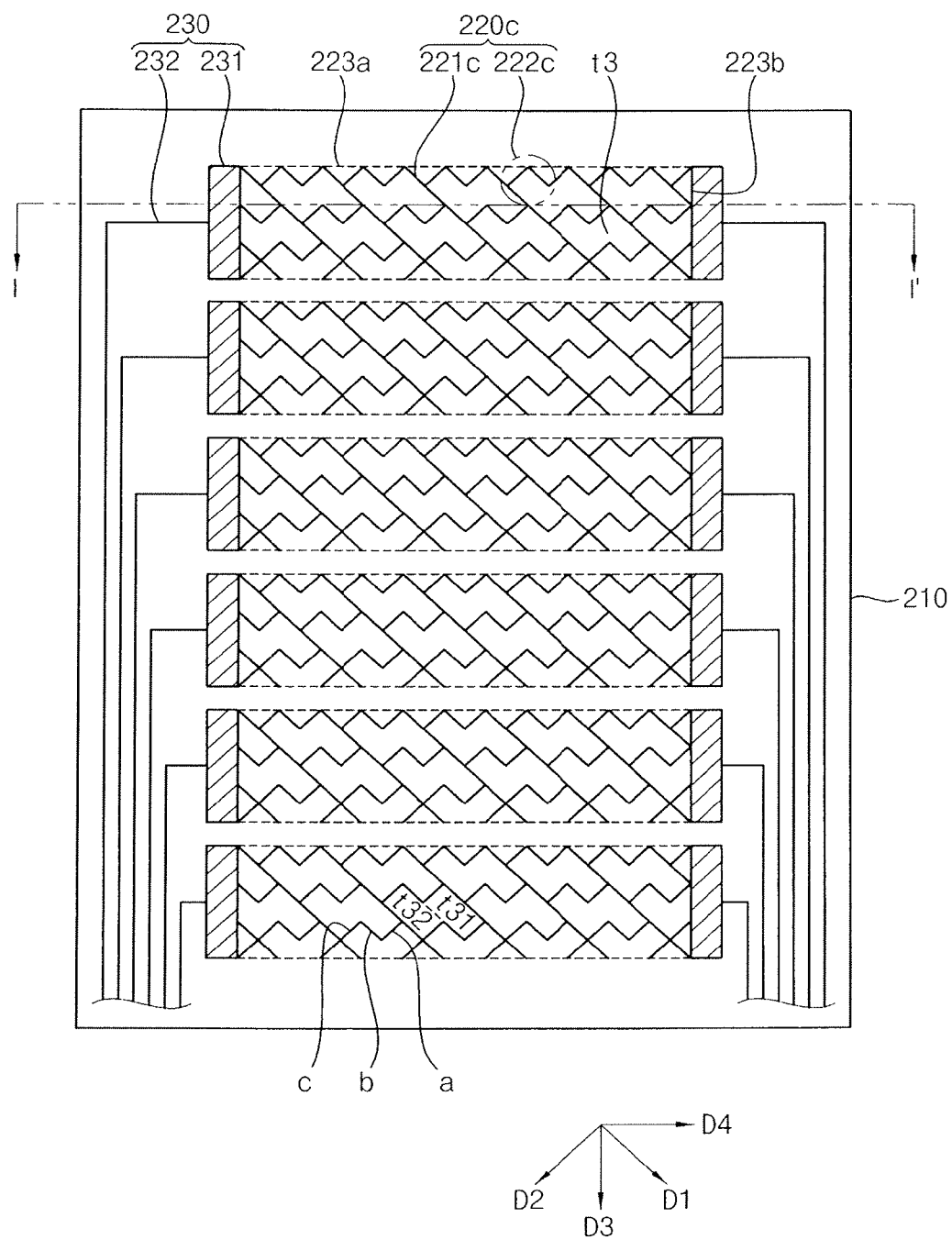

TOUCH SUBSTRATE, METHOD OF MANUFACTURING THE SAME AND DISPLAY DEVICE HAVING THE SAME

CROSS-REFERENCE TO RELATED APPLICATIONS

This application is a divisional of co-pending U.S. application Ser. No. 12/900,658 filed Oct. 8, 2010, which claims priority under 35 U.S.C. §119 to Korean Patent Application No. 10-2009-0101149, filed on Oct. 23, 2009 in the Korean Intellectual Property Office (KIPO), the disclosures of which are incorporated by reference herein in their entireties.

BACKGROUND OF THE INVENTION

1. Technical Field

Example embodiments of the present invention relate to a touch substrate, a method of manufacturing the touch substrate and a display device having the touch substrate. More particularly, example embodiments of the present invention relate to a touch substrate having high reliability, a method of manufacturing the touch substrate and a display device having the touch substrate.

2. Discussion of the Related Art

A touch screen panel (TSP), wherein applying pressure or static electricity on a screen enables a user to input information, has been used. The TSP may be classified as a resistive touch type, a capacitance touch type, etc.

The resistive touch type TSP can be made by contacting two substrates that are coated with transparent electrode layers of indium tin oxide (ITO) as common electrodes such that the transparent electrodes face each other. Dot spacers may be disposed between the two substrates. When the transparent electrode layer coated on one substrate makes contact with a transparent electrode layer coated on the other substrate, the TSP detects an electrical signal to determine a contact position.

To manufacture the resistive touch type TSP, the common electrode is formed through a laser printing method and a wire electrode applying a voltage to the common electrode is made of silver (Ag) through a screen printing method. As a result, there are more processes and manufacturing is complicated.

Moreover, when the ITO common electrodes are repeatedly contacted with each other, the repeated stress on the common electrodes causes touch cracks to be generated so that the reliability of the TSP is decreased. Moreover, since ITO is expensive, the manufacturing cost of the TSP may be increased.

SUMMARY OF THE INVENTION

Example embodiments of the present invention provide a touch substrate having high reliability, a method of manufacturing the above-mentioned touch substrate, and a display device having the above-mentioned touch substrate.

In accordance with an aspect of the present invention, a touch substrate includes a base substrate, a common electrode and a wire electrode. The base substrate has a plurality of common electrode areas. A common electrode is disposed in each of the common electrode areas. The common electrode has a plurality of first electrode lines extended in a first direction and arranged in a second direction crossing the first direction and a plurality of second electrode lines arranged in the first direction. The wire electrode is connected to an end of the common electrode to apply a voltage to the common electrode.

In accordance with an aspect of the present invention, there is provided a method of manufacturing a touch substrate. In the method, a printing substrate is formed. The printing substrate includes a concave pattern corresponding to a common electrode and a wire electrode. The common electrode includes a plurality of first electrode lines extended in a first direction and arranged in a second direction crossing the first direction and a plurality of second electrode lines arranged in the first direction, and connecting adjacent first electrode lines. The wire electrode is connected to an end of the common electrode to apply a voltage to the common electrode. Metal material is spread on the printing substrate to insert the metal material into the concave pattern to form the common and wire electrodes. The common electrode and the wire electrode that are formed in the concave pattern are transferred onto a blanket. The common electrode and the wire electrode formed on the blanket are transferred to a base substrate.

In accordance with an aspect of the present invention, a display device includes a touch panel and a display panel. The touch panel includes a base substrate, a common electrode and a wire electrode. The base substrate has a plurality of common electrode areas. The common electrode has a plurality of first electrode lines extended in a first direction and arranged in a second direction crossing the first direction, and a plurality of second electrode lines arranged in the first direction. The wire electrode is connected to an end of the common electrode to apply a voltage to the common electrode. The display panel displays an image in accordance with an input signal input from the touch panel.

According to a touch substrate, a method of manufacturing the touch substrate and a display device having the touch substrate, a common electrode and a wire electrode are simultaneously formed through a same process using a printing substrate, so that the reliability of a product may be increased. Moreover, the number of the processes to manufacture the touch substrate may be decreased and the manufacturing cost thereof may be reduced.

BRIEF DESCRIPTION OF THE DRAWINGS

The embodiments of the present invention will become more apparent by describing in detailed example embodiments thereof with reference to the accompanying drawings, in which:

FIG. 11 is a plan view illustrating a touch substrate according to an example embodiment of the prevent invention; and FIG. 12 is a plan view illustrating a touch substrate according to an example embodiment of the prevent invention.

DETAILED DESCRIPTION OF EXAMPLE EMBODIMENTS

Figure 1:
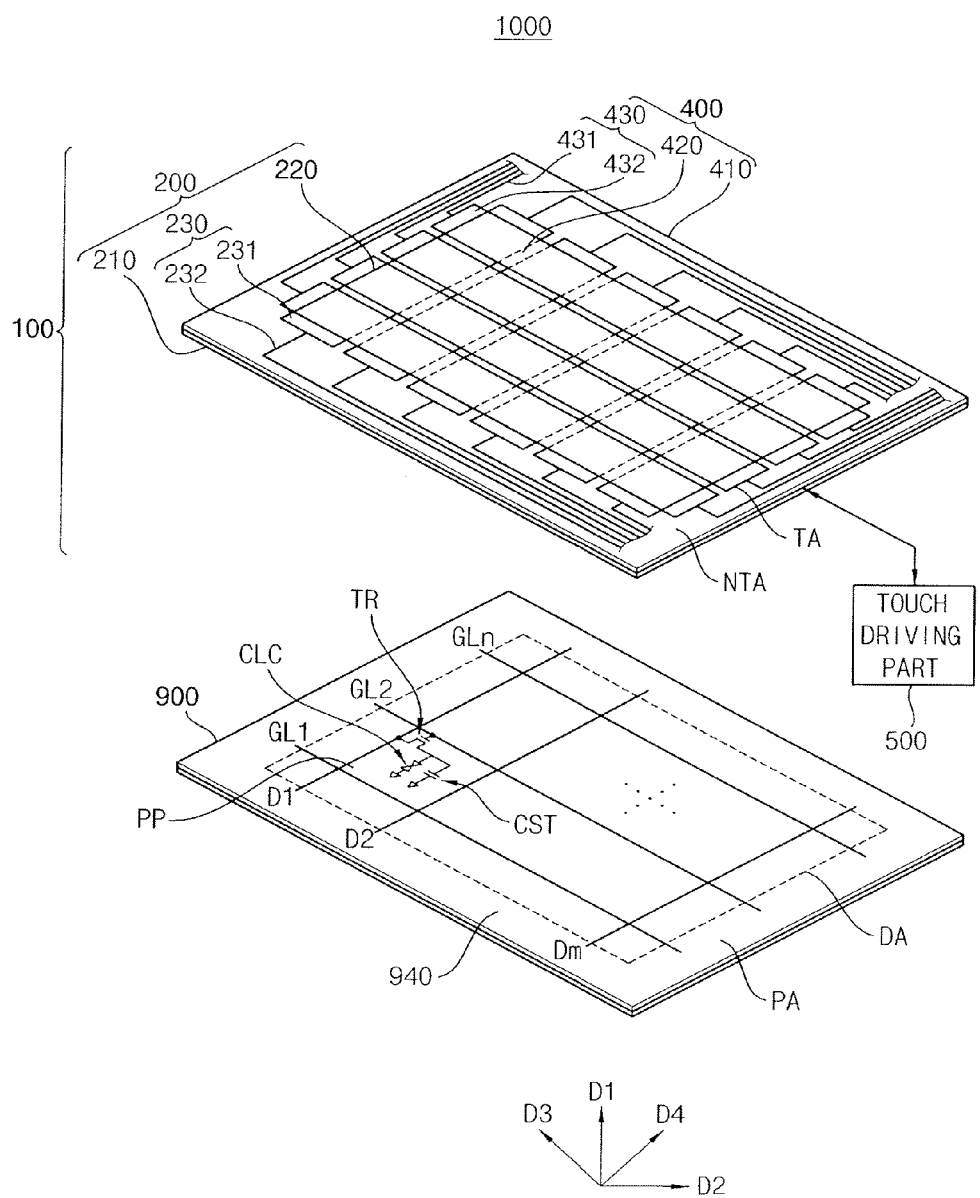
FIG. 1 is a perspective view illustrating a display device according to an example embodiment of the prevent invention.

Example embodiments of the present invention are described more fully hereinafter with reference to the accompanying drawings, in which example embodiments of the present invention are shown. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals may refer to like elements throughout.

Figure 2:
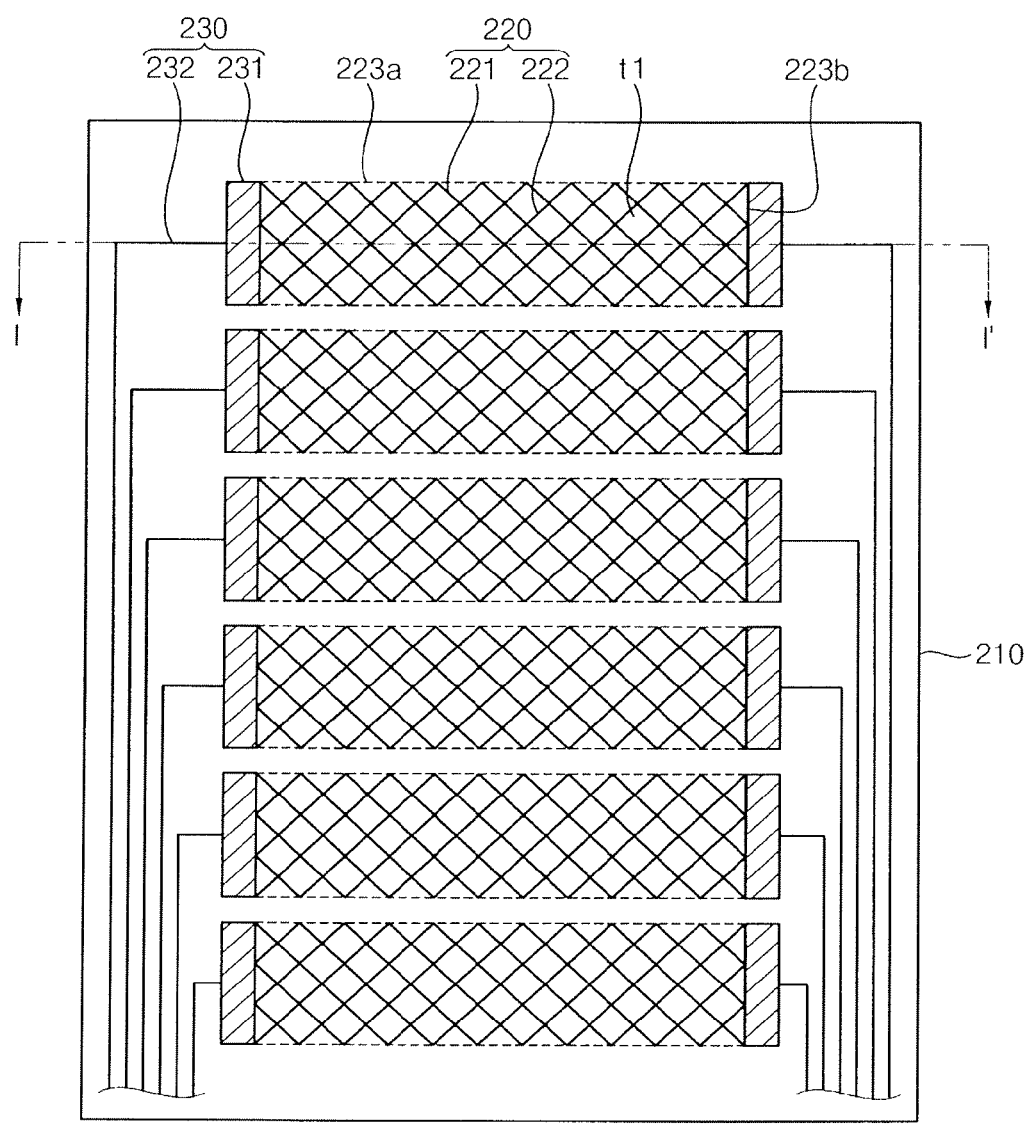
FIG. 2 is a plan view illustrating a touch substrate of FIG. 1.
Figure 3:
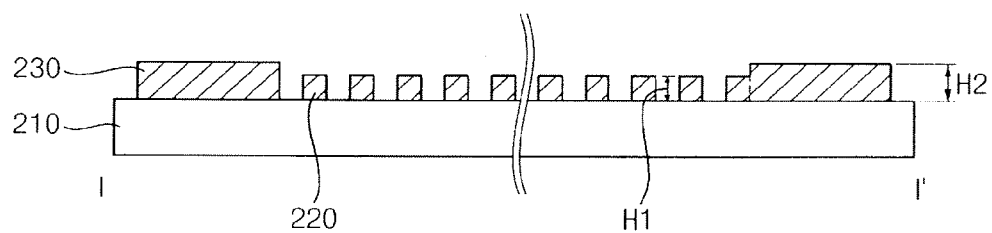
FIG. 3 is a cross-sectional view taken along a line I-I' of FIG. 2.

FIG. 1 is a perspective view illustrating a display device according to an example embodiment of the prevent invention. FIG. 2 is a plan view illustrating a touch substrate of FIG. 1. FIG. 3 is a cross-sectional view taken along a line I-I' in FIG. 2.

Referring to FIGS. 1 to 3, a display device 1000 according to the present example embodiment includes a touch panel 100 and a display panel 900. The touch panel 100 includes a first touch substrate 200 and a second touch substrate 400. The first touch substrate 200 includes a first base substrate 210, a plurality of first common electrodes 220 and a plurality of first wire electrodes 230.

The second touch substrate 400 includes a second base substrate 410, a plurality of second common electrodes 420 and a plurality of second wire electrodes 430. The second touch substrate 400 is positioned opposite to the first touch substrate 200. The second touch substrate 400 is substantially the same as the first touch substrate 200, except that the second touch substrate 400 includes the second common electrodes 420 and the second wire electrodes 430 in a different arrangement direction from the first common electrodes 220 and the first wire electrodes 230 of the first touch substrate 200.

The first touch substrate 200, the first base substrate 210, the first common electrodes 220 and the first wire electrodes 230 are also denoted as a touch substrate 200, a base substrate 210, common electrodes 220 and wire electrodes 230, respectively.

The base substrate 210 may include one of glass, plastic, polyethyleneterephthalate (PET), etc. The base substrate 210 includes a touch area TA in which the first common electrodes 220 are formed and a non-touch area NTA in which the wire electrodes 230 are formed. The non-touch area NTA is adjacent to the touch area TA.

The common electrode 220 includes a plurality of first electrode lines 221 and a plurality of second electrode lines 222. Moreover, the common electrode 220 has a first thickness H1.

According to the present example embodiment, the first electrode lines 221 and the second electrode lines 222 are formed in a common electrode area 223 defined by two first sides 223a shorter than one side of the base substrate 210 and two second sides 223b shorter than the first sides 223a. The common electrode area 223 may have a stripe shape. Alternatively, the common electrode area 223 may be defined by a plurality of sides having different lengths from each other to be a U-shape or an L-shape and is not limited to a specific shape.

The first electrode lines 221 may be extended in a first direction D1 and arranged in a second direction D2 crossing the first direction D1. The second electrode lines 222 may be extended in the second direction D2 and arranged in the first direction D1. Thus, the second electrode lines 222 connect a plurality of the first electrodes 221 that are adjacent to the second electrode lines 222. The first electrode lines 221 and the second electrode lines 222 are regularly arranged, so that the common electrode 220 has a mesh structure.

The common electrode 220 may have a predetermined area resistance by reducing line widths of the first electrode lines 221 and the second electrode lines 222.

The first electrode lines 221 and the second electrode lines 222 cross each other to define a first transmission area t1 transmitting light provided from the display panel 900. The first transmission area t1 may have a rectangular shape. The transmission area t1 according to the present example embodiment may have a transmission rate of more than about 79%.

According to the present example embodiment, the common electrode 220 is, for example, made of silver (Ag) by a gravure offset printing. However, the common electrode 220 may be made of different high resistive metal material other than silver (Ag).

The common electrodes 220 are arranged parallel with a third direction D3 which is along a relatively longer side of the base substrate or with a fourth direction D4 which is along a relatively shorter side of the base substrate.

The wire electrode 230 includes a connection portion 231 and a wire portion 232. The connection portion 231 may be directly connected to the first electrode lines 221 or the second electrode lines 222 disposed adjacent to the second sides 223b in the common electrode area 223. For example, the connection portion 231 may be connected to one end of the common electrode 220. The wire portion 232 is extended from the connection portion 231 to be connected to a touch driving part 500 driving the common electrode 230. The wire electrode 230 applies a voltage provided from the touch driving part 500 to the common electrode 220.

Moreover, the wire electrode 230 has a second thickness H2. The second thickness H2 may be thicker than the first thickness H1 of the common electrode 220, to reduce a resistive value of the wire electrode 230.

In the present example embodiment, the wire electrode 230 is made of silver (Ag) by the gravure offset printing. However, the common electrode 220 may be made of a high resistance metal material other than silver (Ag).

According to an embodiment, the common electrode 220 and the wire electrode 230 are simultaneously made of silver (Ag) by the gravure offset printing.

The display panel 900 includes a plurality of unit pixels PP. The unit pixel PP includes a switching element TR connected to a gate line GL and a data line DL crossing the gate line GL, a liquid crystal capacitor CLC and storage capacitor CST connected to the switching element TR.

Moreover, the display panel 900 includes a display area DA and a peripheral area PA. The display area DA includes the unit pixels PP, and corresponds to the touch area TA of the touch panel 100. The peripheral area PA includes a driving part driving the unit pixel PP connected to the gate line GL and the data line DL, and corresponds to the non-touch area NTA of the touch panel 100. The peripheral area PA is an area excluding the display area DA of the display substrate 940.

The gate lines GL are extended in a third direction D3 which is a long side direction of the display panel 900 and are arranged in a fourth direction D4 crossing the third direction D3. The data lines DL are extended in the fourth direction D4 and are arranged in the third direction D3. For example, the third direction D3 is different from the first direction D1 which is an extending direction of the first electrode lines 221 and the fourth direction D4 crosses the third direction D3.

FIGS. 4A to 4D are cross-sectional views illustrating a printing substrate manufacturing process for manufacturing the touch substrate as shown in FIG. 2.

The touch substrate 200 according to the present example embodiment may be manufactured by gravure offset printing. For gravure offset printing, a gravure offset printing substrate 300 (also referred to herein as a printing substrate) and a blanket 350 (see FIG. 5C) are provided. A first concave pattern 310 and a second concave pattern 320 corresponding to the common electrode 220 and the wire electrode 230, respectively, are formed on the printing substrate 300. The blanket 350 is used to transfer the common electrode 220 and the wire electrode 230 from the printing substrate 300 to the touch substrate 200.

Figure 4A:
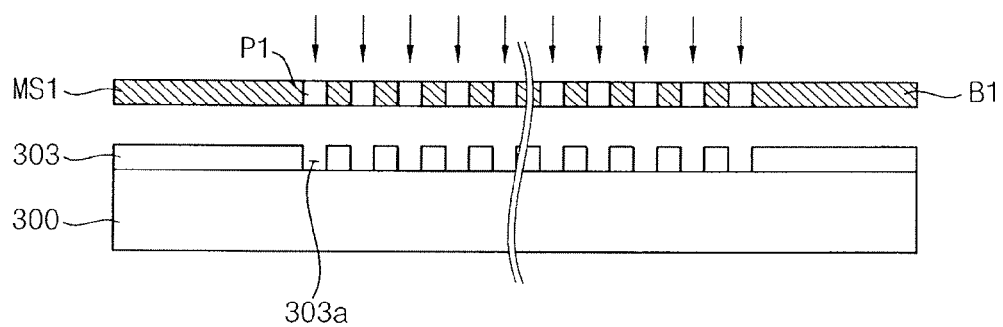
FIGS. 4A to 4D are cross-sectional views illustrating a printing substrate manufacturing process for manufacturing the touch substrate shown in FIG. 2.

Referring to FIGS. 2 and 4A, a photoresist film 303 including photoresist material is formed on the printing substrate 300. A first mask MS1 is disposed over the printing substrate 300 including the photoresist film 303. The first mask MS1 includes a transmitting portion P1 transmitting light and a blocking portion B1 blocking the light. The transmitting portion P1 is disposed at a position corresponding to the common electrode 220 of the touch substrate 200. The photoresist film 303 is patterned using the first mask MS1 to form a first pattern 303*a*.

Figure 4B:
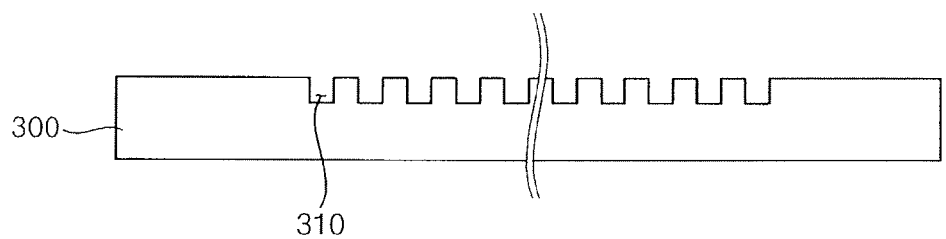

Referring to FIGS. 2 and 4B, the printing substrate 300 including the first photo pattern 303*a* is etched under a first etching condition. The first concave pattern 310 having a first depth D1 is formed in an area corresponding to the first photo pattern 303*a*. Thus, the first concave pattern 310 is formed in a position corresponding to the common electrode 220 of the touch substrate 200, and has the first depth D1.

Figure 4C:
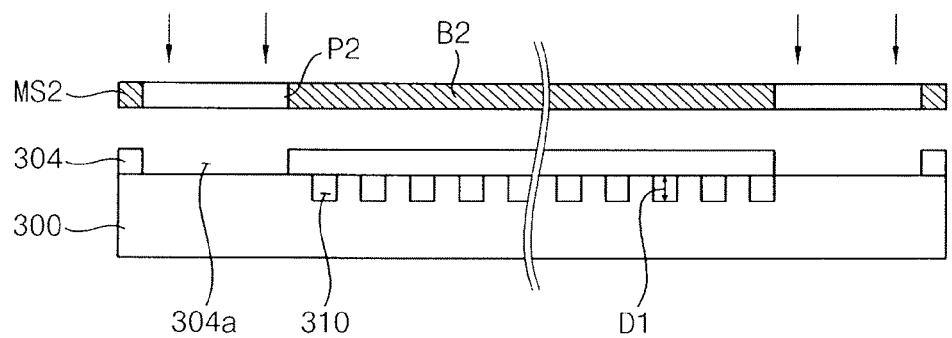

Referring to FIGS. 2 and 4C, a photoresist film 304 of a photoresist material is formed on the printing substrate 300 including the first concave pattern 310. The second mask MS2 is disposed over the printing substrate 300 including the photoresist film 304. The second mask MS2 includes a transmitting portion P2 transmitting the light and a blocking portion B2 blocking the light. The transmitting portion P2 is disposed to correspond to the wire electrode 230 of the touch substrate 200.

The photoresist film 304 is patterned using the second mask MS2 to form a second photo pattern 304*a*.

Figure 4D:
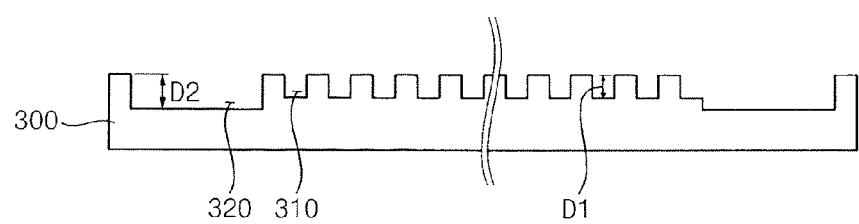

Referring to FIGS. 2 and 4D, the printing substrate 300 including the second photo pattern 304*a* is etched under a second etching condition. The second concave pattern 320 having a second depth D2 is formed in the area corresponding to the second photo pattern 304*a*. The second etching conditions are different from the first etching conditions, so that the second depth D2 is deeper than the first depth. For example, the etching conditions may be varied by changing an etching time and/or an etching liquid.

The second concave pattern 320 is formed at a position corresponding to the wire electrode 230 of the touch substrate 200. Since the second depth D2 is larger than the first depth D1, the resistance of the common electrode 220 corresponding to the first concave pattern 310 is larger than the resistance of the wire electrode 230 corresponding to the second concave pattern 320.

FIGS. 5A to 5D are cross-sectional views illustrating a silver spread process for manufacturing the touch substrate as shown in FIG. 2.

Figure 5A:
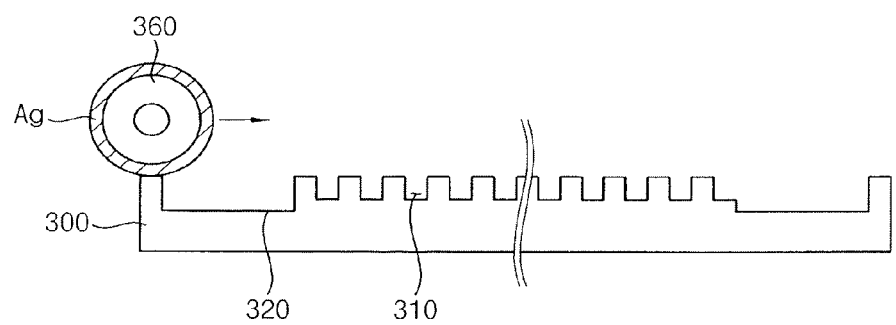
FIGS. 5A to 5D are cross-sectional views illustrating a silver spread process for manufacturing the touch substrate shown in FIG. 2.

Referring to FIGS. 2 and 5A, a roller 360 is disposed on the printing substrate 300 including the first and the second concave patterns 310 and 320. Silver (Ag) is spread on an outer surface of the roller 360.

Figure 5B:
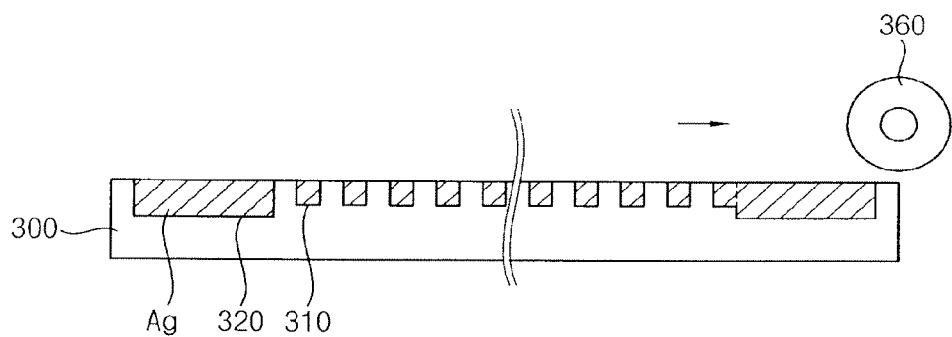

Referring to FIGS. 2 and 5B, the roller 360 is moved on the printing substrate 300, so that silver (Ag) spread on the outer surface of the roller 360 is inserted into the first concave pattern 310 and the second concave pattern 320 formed on the printing substrate 300.

The touch substrate 200 according to the present example embodiment includes the common electrode 220 and the wire electrode 230 including the same metal material, but the common electrode 220 and the wire electrode 230 have different resistances from each other due to their different thicknesses. Accordingly, silver (Ag) may be simultaneously spread in the first concave pattern 310 and the second concave pattern 320 by one single process to form the common and wire electrodes 220 and 230.

Accordingly, the common electrode 220 having the first thickness H1 corresponding to the first depth D1 of the first concave pattern 310 and the wire electrode 230 having the second thickness H2 corresponding to the second depth D2 of the second concave pattern 320 are formed.

Figure 5C:
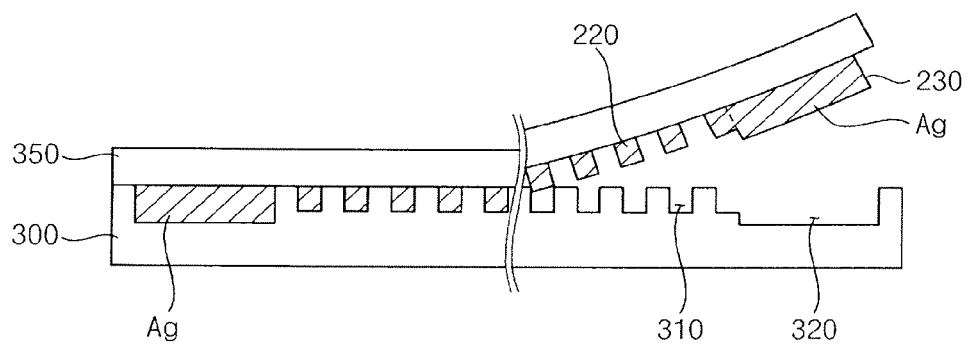

Referring to FIGS. 2 and 5C, the silver (Ag) inserted in the first concave pattern 310 and the second concave pattern 320 formed on the printing substrate 300 becomes the common electrode 220 and the wire electrode 230 according to the shapes of the first concave pattern 310 and the second concave pattern 320. The blanket 350 is disposed on the printing substrate 300. When a predetermined pressure is applied to the entire blanket 350, the common electrode 220 and the wire electrode 230 corresponding to the shapes the first concave pattern 310 and the second concave pattern 320 are simultaneously transferred onto the blanket 350.

Figure 5D:
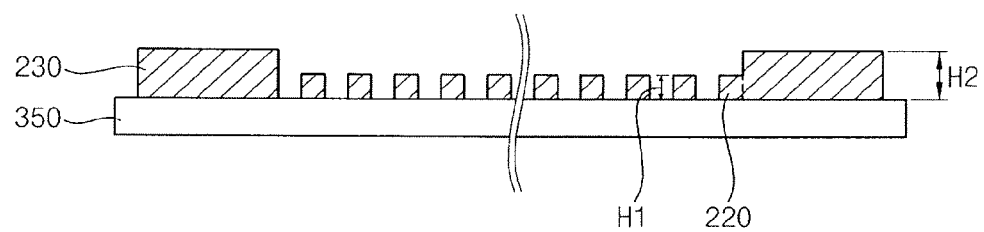

Referring to FIGS. 2 and 5D, the common electrode 220 having the first thickness H1 corresponding to the first depth D1 of the first concave pattern 310 formed on the printing substrate 300 and the wire electrode 230 having the second thickness H2 corresponding to the second depth D2 of the second concave pattern 320 formed on the printing substrate 300 are formed on the blanket 350.

Figure 6A:
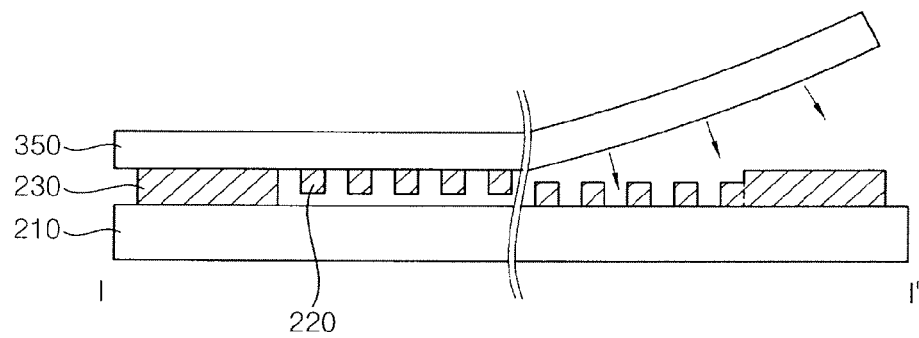
FIGS. 6A to 6B are cross-sectional views illustrating an electrode forming process for manufacturing the touch substrate shown in FIG. 2.
Figure 6B:
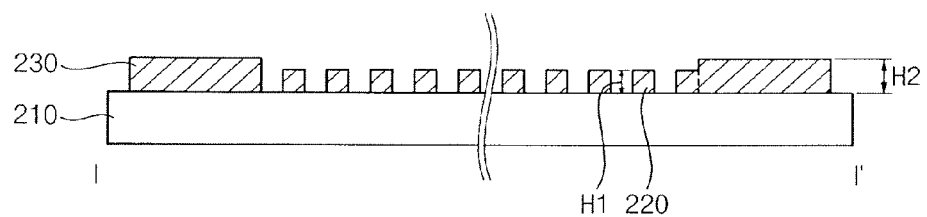

FIGS. 6A to 6B are cross-sectional views illustrating an electrode forming process for manufacturing the touch substrate as shown in FIG. 2.

Referring to FIGS. 2 and 6A, the blanket 350 onto which the common electrode 220 and the wire electrode 230 are transferred is disposed on the base substrate 210, so that the blanket 350 is positioned opposite to the base substrate 210. When a predetermined pressure is applied to the entire blanket 350, the common electrode 220 and the wire electrode 230 are transferred onto the base substrate 210.

Referring to FIGS. 2 and 6B, the common electrode 220 and the wire electrode 230 on the blanket 350 are transferred, so that the common electrode 220 having a first thickness H1 that is substantially the same as a first depth D1 of a first concave pattern 310 of the printing substrate 300 and the wire electrode 230 having a second thickness H2 that is substantially the same as a second depth D2 of a second concave pattern 320 of the printing substrate 300 are formed on the base substrate 210. The second thickness H2 of the wire electrode 230 is larger than the first thickness H1 of the common electrode 220.

According to the present example embodiment, the common electrode and the wire electrode are formed by the same metal using the gravure offset printing, thereby reducing a number of the processes.

Figure 7:
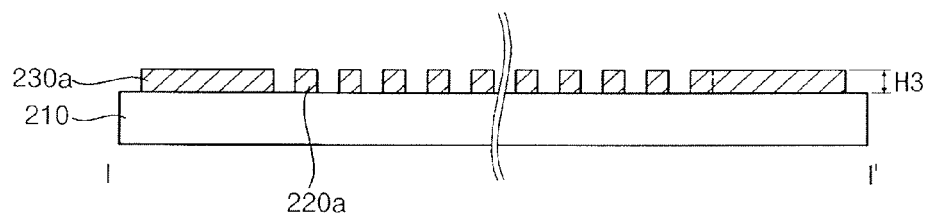
FIG. 7 is a cross-sectional view illustrating a touch substrate according to an example embodiment of the prevent invention.

FIG. 7 is a cross-sectional view illustrating a touch substrate according to an example embodiment of the prevent invention.

In the present example embodiment the common electrode 220a and the wire electrode 230a include a first metal material and a second metal material having different resistances, respectively.

Referring to FIGS. 1, 2 and 7, the touch substrate 200A according to the present example embodiment includes a base substrate 210, a plurality of common electrodes 220a and a plurality of wire electrodes 230a.

The common electrodes 220a include a plurality of first electrode lines 221a and a plurality of second electrode lines 222a. The common electrode 220a has a third thickness H3. The common electrode 220a includes a first metal material MT1 having a first resistance, and is formed by a gravure offset printing.

The first electrode lines 221a are extended in a first direction D1 and arranged in a second direction D2 crossing the first direction D1. The second electrode lines 222a are extended in the second direction D2 and arranged in the first direction D1. The second electrode lines 222a connect adjacent first electrode lines 221a. Thus, the first electrode lines 221a and the second electrode lines 222a are regularly arranged, so that the common electrode 220a has a mesh structure.

Moreover, line widths of the first electrode lines 221a are reduced, so that the first electrode lines 221a and the second electrode lines 222a may have a predetermined area resistance.

The wire electrode 230a includes a connection portion 231a and a wire portion 232a. Moreover, the wire electrode 230a also has the third thickness H3 that is the same with the thickness of the common electrode 220a.

The wire electrode 230a includes a second metal material MT2 having a second resistance smaller than the first resistance, and is formed by the gravure offset printing.

FIGS. 8A to 8D are cross-sectional views illustrating a method of manufacturing a printing substrate for manufacturing the touch substrate as shown in FIG. 7.

The touch substrate 200A according to the present example embodiment may be manufactured by the gravure offset printing.

A first gravure offset printing substrate 301a (also referred to as a first printing substrate), a second gravure offset printing substrate 301b (also referred to as a second printing substrate), a first blanket 370a (see FIG. 9C) and a second blanket 370b (see FIG. 9G) are provided for the gravure offset printing. The first concave pattern 310a and the second concave pattern 320a corresponding to the common electrode 220a and the wire electrode 230a, respectively, may be formed on the first printing substrate 301a and the second printing substrate 301b, respectively. The first blanket 370a may be used for transferring the common electrode 220a from the first printing substrate 301a to the base substrate 210 of the touch substrate 200A. The second blanket 370b may be used for transferring the wire electrode 230a from the second printing substrate 301b to the base substrate 210 of the touch substrate 200A.

Figure 8A:
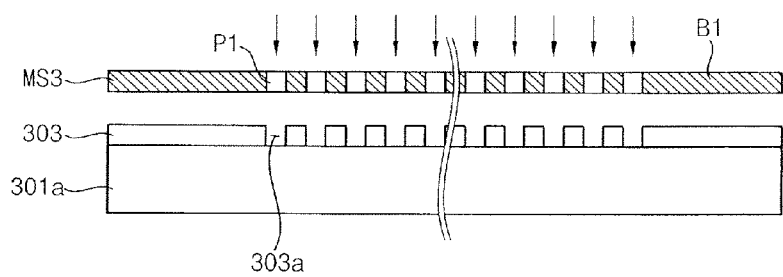
FIGS. 8A to 8D are cross-sectional views illustrating a printing substrate manufacturing processes for manufacturing the touch substrate shown in FIG. 7.

Referring to FIGS. 7 and 8A, a photoresist film 303 including photoresist material is formed on the first printing substrate 301a. A third mask MS3 is disposed over the first printing substrate 301a including the photoresist film 303. The third mask MS3 includes a transmitting portion P1 transmitting light and a blocking portion B1 blocking the light, and the transmitting portion P1 is disposed at a position corresponding to the common electrode 220a of the touch substrate 200A.

The photoresist film 303 is patterned using the third mask MS3 to form a first photo pattern 303a.

Figure 8B:
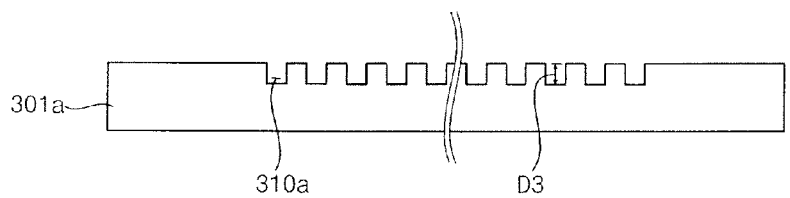

Referring to FIGS. 7 and 8B, the first printing substrate 301a including the first photo pattern 303a is etched under a third etching condition. The first concave pattern 310a with a third depth D3 is formed in the area corresponding to the first photo pattern 303a. Thus, the first concave pattern 310a is formed in a position corresponding to the common electrode 220a of the touch substrate 210 with the third depth D3.

Figure 8C:
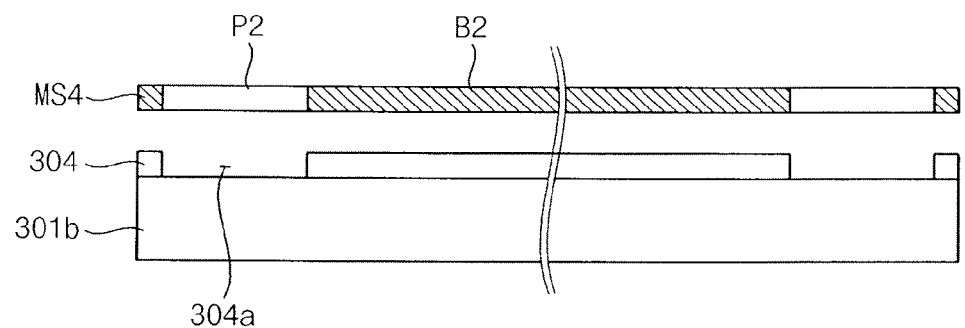

Referring to FIGS. 7 and 8C, a photoresist film 304 of a photoresist material is formed on the second printing substrate 301b. A fourth mask MS4 is disposed over the second printing substrate 301b including the photoresist film 304. The fourth mask MS4 includes a transmitting portion P2 transmitting light and a blocking portion B2 blocking the light, and the transmitting portion P2 is disposed at a position corresponding to the wire electrode 230a of the touch substrate 200A.

The photoresist film 304 is patterned using the fourth mask MS4 to form the second photo pattern 304a.

Figure 8D:
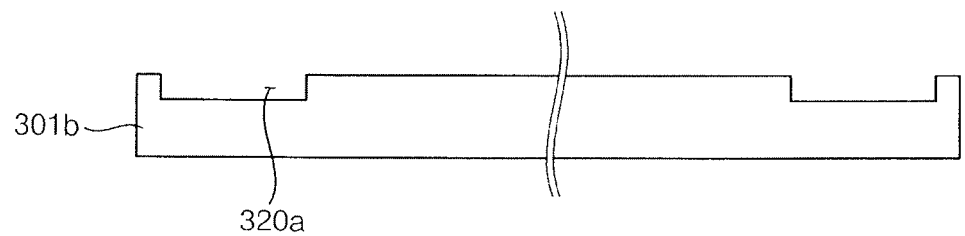

Referring to FIGS. 7 and 8D, the second printing substrate 301b including the second photo pattern 304a is etched under a fourth etching condition. The second concave pattern 320a with the third depth D3 is formed in the area corresponding to the second photo pattern 304a. Thus, the second concave pattern 320a is formed in a position corresponding to the wire electrode 230a of the touch substrate 210A with the third depth D3.

Since the first concave pattern 310a and the second concave pattern 320a have the same third depth D3, the etching condition of the first concave pattern 310a is the same as the etching condition of the second concave pattern 320a.

FIGS. 9A to 9H are cross-sectional views illustrating a silver spread process for manufacturing the touch substrate as shown in FIG. 7.

Figure 9A:
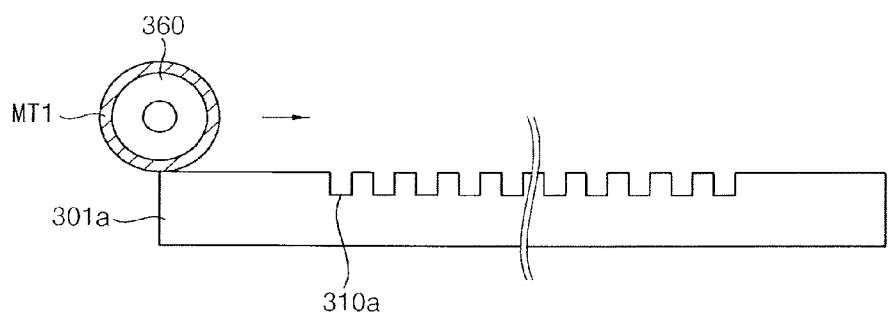
FIGS. 9A to 9H are cross-sectional views illustrating a silver spread process for manufacturing the touch substrate shown in FIG. 7.

Referring to FIGS. 7 and 9A, a roller 360 is disposed on the first printing substrate 301a including the first concave pattern 310a. A first metal material MT1 is spread on an outer surface of the roller 360.

Figure 9B:
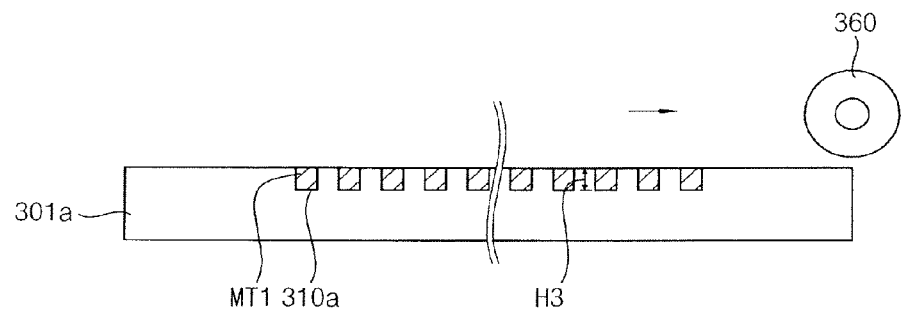

Referring to FIGS. 7 and 9B, the roller 360 is moved on the first printing substrate 301a, so that the first metal material MT1 spread on the outer surface of the roller 360 is inserted into the first concave pattern 310a formed on the first printing substrate 301a. Thus, the first metal material MT1 inserted into the first concave pattern 310a becomes the common electrode 220a of the touch substrate 200A.

Figure 9C:
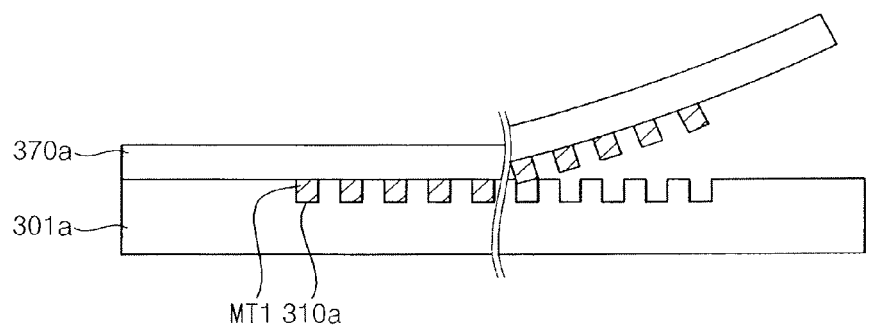

Referring to FIGS. 7 and 9C, the first metal material MT1 inserted in the first concave pattern 310a formed on the first printing substrate 301a becomes the common electrode 220a corresponding to a shape of the first concave pattern 310a. The first blanket 370a is disposed on the first printing substrate 301a. When a predetermined pressure is applied to the entire first blanket 370a, the common electrode 220a corresponding to the first concave pattern 310a on the first printing substrate 301a is transferred onto the first blanket 370a.

Figure 9D:
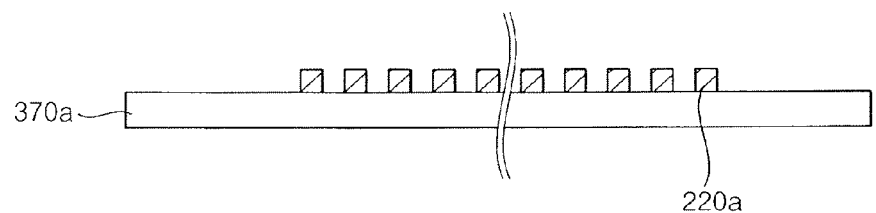

Referring to FIGS. 7 and 9D, the common electrode 220 having the third thickness H3 corresponding to the third depth D3 of the first concave pattern 310a is formed on the first blanket 370a.

Figure 9E:
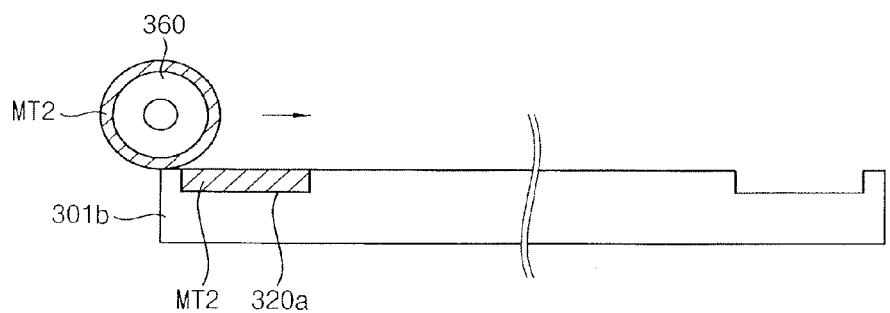

Referring to FIGS. 7 and 9E, a roller 360 is disposed on the second printing substrate 301b including the second concave pattern 320a. A second metal material MT2 is spread on an outer surface of the roller 360.

Figure 9F:
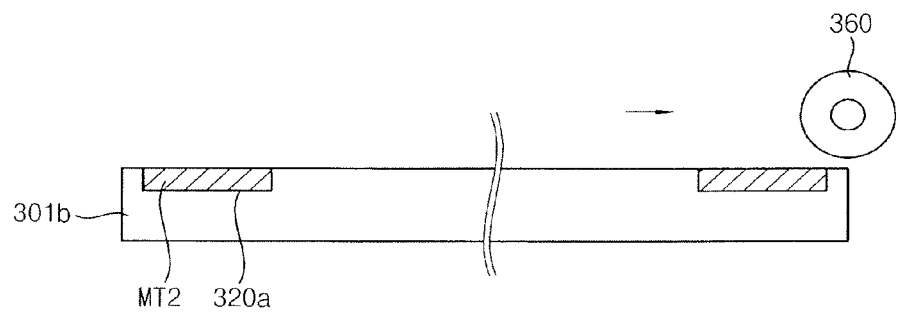

Referring to FIGS. 7 and 9F, the roller 360 is moved on the second printing substrate 301b, so that the second metal material MT2 spread on the outer surface of the roller 360 is inserted into the second concave pattern 320a formed on the second printing substrate 301b. Thus, the second metal material MT2 inserted into the second concave pattern 320a becomes the wire electrode 230a of the touch substrate 200A.

Figure 9G:
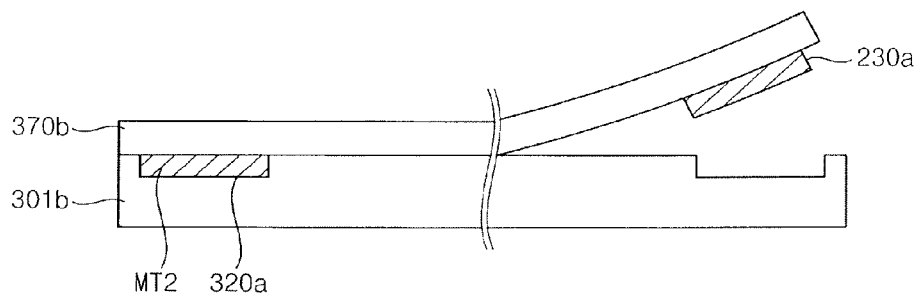
Figure 9H:
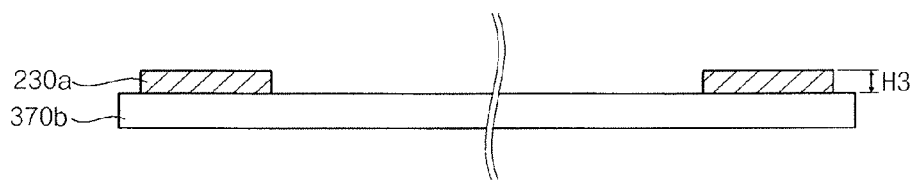

Referring to FIGS. 7 and 9G, the second metal material MT2 inserted into the second concave pattern 320a formed on the second printing substrate 301b becomes the wire electrode 230a corresponding to a shape of the second concave pattern 320a. The second blanket 370b is disposed on the second printing substrate 301b. When a predetermined pressure is applied to the entire second blanket 370b, the wire electrode 230a corresponding to the second concave pattern 320a on the second printing substrate 301b is transferred onto the second blanket 370b.

Referring to FIGS. 7 and 9G, the wire electrode 230a having the third thickness H3 corresponding to the third depth D3 of the second concave pattern 320a formed on the second printing substrate 301b is formed on the second blanket 370b.

In the touch substrate 200A according to the present example embodiment, since the common electrode 220a and the wire electrode 230a have the same thickness but are made of different metal materials having different resistances from each other, the first metal material MT1 is spread in the first concave pattern 310a and the second metal material MT2 is spread in the second concave pattern 320a.

The first metal material MT1 and the second metal material MT2 may include, for example, silver (Ag). Thus, the first metal material MT1 and the second metal material MT2 may be silver (Ag) or silver alloy.

FIGS. 10A to 10D are cross-sectional views illustrating an electrode forming process for manufacturing the touch substrate as shown in FIG. 7.

Figure 10A:
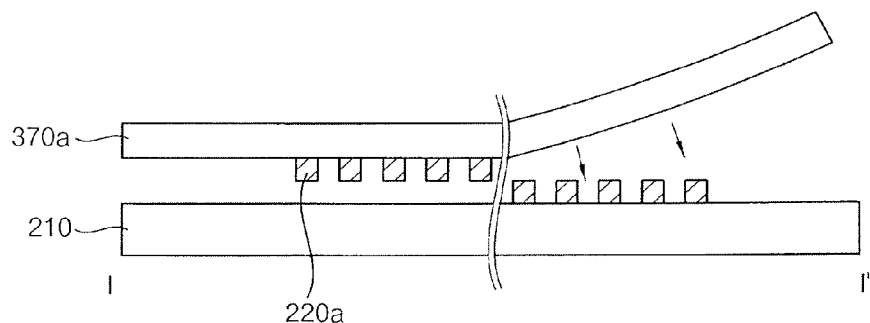
FIGS. 10A to 10D are cross-sectional views illustrating an electrode forming process for manufacturing the touch substrate shown in FIG. 7.

Referring to FIGS. 7 and 10A, the first blanket 370a including the common electrode 220a is disposed to be opposite to the base substrate 210. When a predetermined pressure is applied to the entire first blanket 370a, the common electrode 220a is transferred onto the base substrate 210.

Figure 10B:
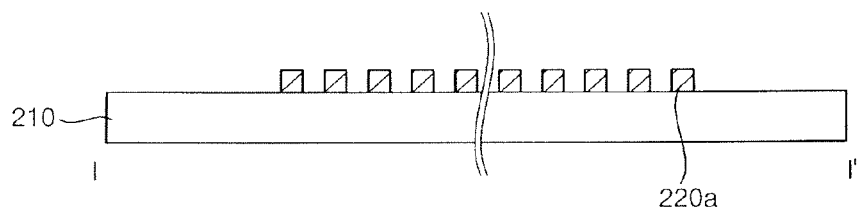

Referring to FIGS. 7 and 10B, the common electrode 220a on the first blanket 370a is transferred, so that the common electrode 220a having a third thickness H3 corresponding to a third depth D3 of the first concave pattern 310a of the first printing substrate 301a is formed on the base substrate 210.

Figure 10C:
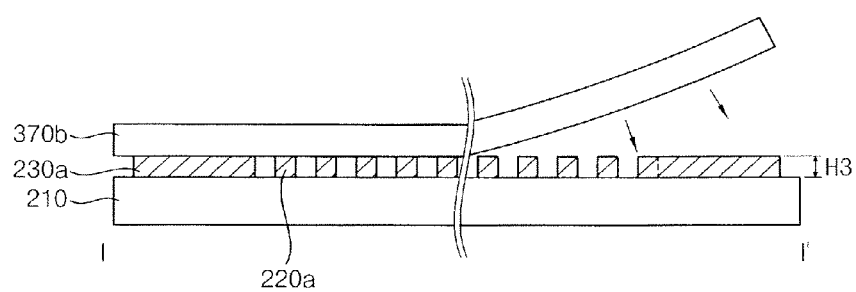

Referring to FIGS. 7 and 10C, the second blanket 370a including the wire electrode 230a is disposed to be opposite to the base substrate 210a. As described in FIGS. 10A and 10B, the common electrode 220a is formed on the base substrate 210. When a predetermined pressure is applied to the entire second blanket 370b, the wire electrode 230a is transferred onto the base substrate 210.

Figure 10D:
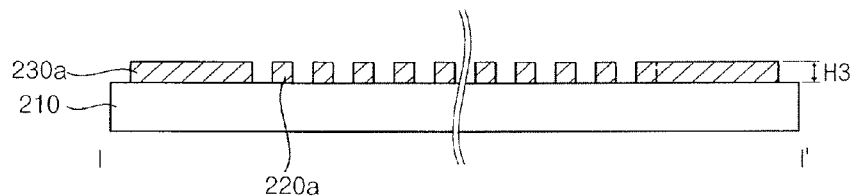

Referring to FIGS. 7 and 10D, the wire electrode 230a on the second blanket 370b is transferred, so that the wire electrode 230a having the third thickness H3 corresponding to the third depth D3 of the second concave pattern 320a of the second printing substrate 301b is formed on the base substrate 210a.

Accordingly, the common electrode 220a is made of metal material different from the wire electrode 230a, and the thickness H3 of the common electrode 220a is the same as the thickness H3 of the wire electrode 230a.

According to the present example embodiment, the common electrode and the wire electrode are formed by gravure offset printing, thereby reducing the number of the processes.

FIG. 11 is cross-sectional view illustrating a touch substrate according to an example embodiment of the prevent invention.

In the present example embodiment the common electrode is different from the common electrode of the example embodiment of FIG. 2.

Referring to FIGS. 1 and 11, the touch substrate 200B according to the present example embodiment includes a base substrate 210, a plurality of common electrodes 220b and a plurality of wire electrodes 230.

The common electrode 220b includes a plurality of first electrode lines 221b and a plurality of second electrode lines 222b. Moreover, the common electrode 220b has a first thickness H1.

According to the present example embodiment, the first electrode lines 221b and the second electrode lines 222b are formed in a common electrode area 223 defined by two first sides 223a shorter than one side of the base substrate 210 and two second sides 223b shorter than the first sides 223a. The common electrode area 223 may be a stripe shape. Moreover, the common electrode area 223 may be defined by a plurality of sides having different lengths from each other to be a U-shape or an L-shape and is not limited to a specific shape.

The first electrode lines 221b may be extended in a first direction D1 to be arranged in a second direction D2 crossing the first direction D1. The second electrode lines 222b may be extended in the second direction D2 to be arranged in the first direction D1. Thus, the second electrode lines 222b connect two the first electrode lines 221b that are adjacent to the second electrode lines 222b. Moreover, the second electrode lines 222b adjacent to each other in the first direction D1 connect two same first electrode lines 221b.

For example, each of the second electrodes lines 222b is shifted in the first direction D1 by a predetermined space with respect to the adjacent second electrode lines 222b in the second direction D2. For example, each of the second electrode lines 222b is not connected to the second electrode lines 222b adjacent in the second direction D2. The second electrode lines 222b connect adjacent first electrode lines 221b in the second direction D2.

The first electrode lines 221b and the second electrode lines 222b may have an area resistance of about 200Ω/sq.

A second transmitting area t2 transmits the light provided from the display panel 900 by the first electrode lines 221b and the second electrode lines 222b. The second transmitting area t2 may be, for example, a square or rectangular shape. The second transmitting area t2 is disposed with an adjacent second transmitting area t2 sharing a portion of the first electrode line 221b in a zigzag shape.

For example, the second transmitting area t2 includes two long sides which are the first electrode lines 221b and opposite to each other and two short sides which are the second electrode lines 222b and opposite to each other. Thus, the second transmitting area t2 has a rectangular shape. The second transmitting area t2 is shifted from the adjacent second transmitting area t2 in the second direction D2 and shares part of the long sides of two adjacent second transmitting areas t2 in the first direction D1.

The second transmitting area t2 according to the present example embodiment is wider than the first transmitting area t1 according to the example embodiment of FIG. 2. As a result, the second transmitting area t2 has a larger transmitting rate than the first transmitting area t1.

The wire electrode 230 includes a connection portion 231 and a wire portion 232. The connection portion 231 is directly connected to the first electrode lines 221b or the second electrode lines 222b disposed at the second sides 223b of the common electrode area 223. The wire portion 232 may be extended from the connection portion 231 to be connected to the touch driving part 500 driving the common electrode 220b. The wire electrode 230 applies a voltage provided from the touch driving part 500 to the common electrode 220b. Moreover, the wire electrode 230 has a second thickness H2.

The touch substrate 200B according to the present example embodiment may be manufactured in the manufacture method of the touch substrate 200 according to the example embodiment of FIG. 2.

For example, referring to FIGS. 4A to 6B, the touch substrate 200B according to the present example embodiment may be manufactured by the gravure offset printing. A gravure offset printing substrate 300 and a blanket 350 are provided for the gravure offset printing. A first concave pattern 310 and a second concave pattern 320 corresponding to each of the common electrode 220b and the wire electrode 230 may be formed on the printing substrate 300. The blanket 350 may be used for transferring the common electrode 220b and the wire electrode 230 from the printing substrate 300 to the base substrate 210 of the touch substrate 200B. The method of manufacturing the touch substrate 200B according to the present example embodiment may be substantially the same as the method of manufacturing the touch substrate 200 of the example embodiment of FIG. 2.

Alternatively, the touch substrate 200B according to the present example embodiment may be manufactured in the manufacture method of the touch substrate 200A according to the example embodiment of FIG. 7.

For example, referring to FIGS. 8A to 10D, a first printing substrate 301a, a second printing substrate 301b, a first blanket 370a and a second blanket 370b are provided for the gravure offset printing. A first concave pattern 310a and a second concave pattern 320b corresponding to each of the common electrode 220b and the wire electrode 230 may be formed on each of the first printing substrate 301a and the second printing substrate 301b. The first blanket 370a may be used for transferring the common electrode 220b from the first printing substrate 301a to the base substrate 210 of the touch substrate 200B. The second blanket 370b may be used for transferring the wire electrode 230 from the second printing substrate 301b to the base substrate 210 of the touch substrate 200B. The method of manufacturing the touch substrate 200B according to the present example embodiment may be substantially the same as the method of manufacturing the touch substrate 200B of the example embodiment of FIG. 7.

According to the present example embodiment, a structure of the common electrode 220b is changed to increase the transmitting area, thereby further improving a transmitting rate and a resistance compared to those of the example embodiment of FIG. 2.

FIG. 12 is cross-sectional view illustrating a touch substrate according to an example embodiment of the prevent invention.

The present example embodiment is substantially the same as the example embodiment of FIG. 2, except that the common electrode 220c is different from the common electrode 220 of the example embodiment of FIG. 2.

Referring to FIGS. 1 and 12, the touch substrate 200C according to the present example embodiment includes a base substrate 210, a plurality of common electrodes 220c and a plurality of wire electrodes 230.

The common electrode 220c includes a plurality of first electrode lines 221c and a plurality of second electrode lines 222c. Moreover, the common electrode 220c has a first thickness H1.

According to the present example embodiment, the first electrode lines 221c and the second electrode lines 222c are formed in a common electrode area 223 defined by two first sides 223a shorter than one side of the base substrate 210 and two second sides 223b shorter than the first sides 223a. The common electrode area 223 may be a stripe shape. Alternatively, the common electrode area 223 may be defined by a plurality of sides having different lengths from each other to be a U-shape or an L-shape and is not limited to a specific shape.

The first electrode lines 221c are extended in a first direction D1 and arranged in a second direction D2 crossing the first direction D1.

The second electrode lines 222c include a first portion a extended in the second direction D2, a second portion b extended from a first end of the first portion a in the first direction D1 and a third portion c extended from a first end of the second portion b in the second direction D2. For example, the second electrode lines 222c have a step shape which is bent between the first portion a and the second portion b and between the second portion b and the third portion c and connects adjacent first electrode lines 221b.

The first electrode lines 221c and the second electrode lines 222c define a third transmitting area t3 transmitting light provided from the display panel 900. The third transmitting area t3 has a shape of which a first rectangular portion t31 is shifted in the first direction D1 from a second rectangular portion t32.

Since the third transmitting area t3 according to the present example embodiment is larger than the first transmitting area t1 of the example embodiment of FIG. 2, the touch substrate 200C has a larger transmitting rate than the touch substrate 200.

The wire electrode 230 includes a connection portion 231 and a wire portion 232. The connection portion 231 is directly connected to the first electrode lines 221c or the second electrode lines 222c disposed at the second sides 223b of the common electrode area 223. The wire portion 232 is extended from the connection portion 231 to be connected to the touch driving part 500 driving the common electrode 220c. The wire electrode 230 applies a voltage provided from the touch driving part 500 to the common electrode 220c. Moreover, the wire electrode 230 has a second thickness H2.

The touch substrate 200C according to the present example embodiment may be manufactured in a manufacture method of the touch substrate 200 according to the example embodiment of FIG. 2.

For example, referring to FIGS. 4A to 6B, the touch substrate 200C according to the present example embodiment may be manufactured by the gravure offset printing. A printing substrate 300 and a blanket 350 may be provided for the gravure offset printing. A first concave pattern 310 and a second concave pattern 320 corresponding to each of the common electrode 200c and the wire electrode 230 may be formed. The blanket 350 may be used to transfer the common electrode 220c and the wire electrode 230 from the printing substrate 300 to the base substrate 210 of the touch substrate 200C. The method of manufacturing the touch substrate 200C according to the present example embodiment is substantially the same as the method of manufacturing the touch substrate 100 according to the example embodiment of FIG. 2.

Alternatively, the touch substrate 200C of the present example embodiment may be manufactured in a manufacture method of the touch substrate 200A according to the example embodiment of FIG. 7.

For example, referring to FIGS. 8A to 10D, a first printing substrate 301a, a second printing substrate 301b, a first blanket 370a and a second blanket 370b may be provided for the gravure offset printing. The first concave pattern 310a and the second concave pattern 310b corresponding to the common electrode 220c and the wire electrode 230 are formed in each of the first printing substrate 301a and the second printing substrate 301b. The first blanket 370a may be used for transferring the common electrode 220c from the first printing substrate 301a to the base substrate 210 of the touch substrate 200C. The second blanket 370b may be used for transferring the wire electrode 230 from the second printing substrate 301b to the base substrate 210 of the touch substrate 200C. The method of manufacturing the touch substrate 200C according to the present example embodiment may be substantially the same with the method of manufacturing the touch substrate 200A according to the example embodiment of FIG. 7.

According to the present example embodiment, the structure of the common electrode 220c is changed, so that a transmitting area may be increased. Thus, a transmittance and a surface resistance are improved.

According to the embodiments of present invention, a common electrode and a wire electrode are simultaneously formed through a same process using a printing substrate, so that the reliability of a product may be increased. Moreover, the number of the processes to manufacture thr touch substrate may be decreased and the manufacturing cost thereof may be reduced.

The foregoing is illustrative of the present disclosure and is not to be construed as limiting thereof. Although a few example embodiments of the present invention have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A method of manufacturing a touch substrate, the method comprising:
    forming a printing substrate comprising a concave pattern corresponding to a common electrode and a wire electrode, the common electrode comprising a plurality of first electrode lines extended in a first direction and arranged in a second direction different from the first direction and a plurality of second electrode lines arranged in the first direction to connect adjacent first electrode lines, and the wire electrode being connected to an end of the common electrode to apply a voltage to the common electrode;
    spreading a metal material on the printing substrate to insert the metal material into the concave pattern to form the common electrode and wire electrode;
    transferring the common electrode and the wire electrode that are formed in the concave pattern onto a blanket; and
    transferring the common electrode and the wire electrode formed on the blanket to a base substrate.

2. The method of claim 1, wherein forming the printing substrate comprises:
    forming a first concave pattern having a first depth in a first area of the printing substrate; and
    forming a second concave pattern having a second depth deeper than the first depth in a second area of the printing substrate.

3. The method of claim 2, further comprising:
    spreading the metal material into the first concave pattern and the second concave pattern, wherein the metal material formed in the first concave pattern has a first thickness corresponding to the first depth and forms the common electrode, and the metal material formed in the second concave pattern has a second thickness corresponding to the second depth and forms the wire electrode.

4. The method of claim 3, wherein the metal material comprises silver (Ag).

5. The method of claim 1, wherein forming the printing substrate comprises:
    forming a first concave pattern having a first depth on a first printing substrate; and
    forming a second concave pattern having the first depth on a second printing substrate.

6. The method of claim 5, further comprising:
    spreading a first metal material of a first resistance into the first concave pattern to form the common electrode;
    transferring the common electrode onto a first blanket, the common electrode having a first thickness corresponding to the first depth;
    spreading a second metal material of a second resistance smaller than the first resistance into the second concave pattern to form the wire electrode; and
    transferring the wire electrode onto a second blanket, the wire electrode having the first thickness corresponding to the first depth.

7. The method of claim 6, wherein transferring the common electrode and the wire electrode to the base substrate comprises:
    transferring the common electrode from the first blanket onto the base substrate; and
    transferring the wire electrode from the second blanket onto the base substrate.

8. The method of claim 6, wherein the first and second metal materials comprise silver (Ag).

* * * * *